US006861091B2

(12) United States Patent
Sellinger

(10) Patent No.: US 6,861,091 B2
(45) Date of Patent: Mar. 1, 2005

(54) SELF-ASSEMBLY OF ORGANIC-INORGANIC NANOCOMPOSITE THIN FILMS FOR USE IN HYBRID ORGANIC LIGHT EMITTING DEVICES (HLED)

(75) Inventor: Alan Sellinger, San Jose, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 737 days.

(21) Appl. No.: 09/749,006

(22) Filed: Dec. 27, 2000

(65) Prior Publication Data

US 2005/0019602 A1 Jan. 27, 2005

(51) Int. Cl.[7] .............................. B05D 5/06; B05D 7/24; H01J 1/63
(52) U.S. Cl. ...................... 427/157; 427/64; 427/162; 427/169; 427/372.2; 427/385.5; 427/397.7; 428/690
(58) Field of Search ........................ 427/64, 157, 162, 427/164, 169, 372.2, 373, 385.5, 397.7; 428/690; 313/483, 503, 504, 506

(56) References Cited

U.S. PATENT DOCUMENTS

| | | | | |
|---|---|---|---|---|
| 5,783,292 A | * | 7/1998 | Tokito et al. ............... | 428/212 |
| 6,297,842 B1 | * | 10/2001 | Koizumi et al. ............ | 347/237 |
| 6,361,885 B1 | * | 3/2002 | Chou ......................... | 428/690 |
| 6,399,221 B1 | * | 6/2002 | Marks et al. ............... | 428/690 |
| 6,420,056 B1 | * | 7/2002 | Chondroudis et al. ...... | 428/690 |
| 6,517,958 B1 | * | 2/2003 | Sellinger et al. ........... | 428/690 |
| 6,586,763 B2 | * | 7/2003 | Marks et al. ............... | 257/40 |

OTHER PUBLICATIONS

Sellinger et al., "Continuous self–assembly of organic–inorganic nanocomposite coatings that mimic nacre", Nature, vol. 394, pp. 256–260, Jul. 1998.*

* cited by examiner

Primary Examiner—Shrive P. Beck
Assistant Examiner—Wesley D. Markham
(74) Attorney, Agent, or Firm—Fitzpatrick, Cella, Harper & Scinto

(57) ABSTRACT

A self-assembly process for preparing luminescent organic-inorganic nanocomposite thin films is disclosed. A homogeneous solution in water and an organic solvent is obtained containing a soluble silicate, a silica coupling agent, a surfactant, and an organic material having a hole transport, electron transport, and/or emissive material moiety. The silica coupling agent is selected to chemically react with the organic material. A film of the homogeneous solution is deposited onto a substrate. Preferentially evaporating the organic solvent enriches the concentration of water and non-volatile solution components to promote micelle formation. Organic materials migrate into the hydrophobic portion of the forming micelles. Continued evaporation promotes self-assembly of the micelles into interfacially organized liquid crystalline mesophases. Reacting the organic material and silica coupling forms a nanostructure self-assembly. Luminescent ordered nanocomposite structures prepared by the process, and organic-inorganic HLED devices fabricated from the luminescent organic-inorganic nanocomposite structures are disclosed.

28 Claims, 2 Drawing Sheets

SELF-ASSEMBLY OF ORGANIC-INORGANIC NANOCOMPOSITE THIN FILMS FOR USE IN HYBRID ORGANIC LIGHT EMITTING DEVICES (HLED)

TECHNICAL FIELD

A method is presented for producing new light emitting device material formed by the spontaneous evaporation-induced self-assembly of hole transport, electron transport, and emissive materials into layered organic/inorganic nanocomposite thin films. The thin films are deposited by dip-, spin-, or printing processes and form the layered material in less than 20 seconds. Subsequent curing by photo, thermal and/or chemical methods stabilizes the films for OLED application.

BACKGROUND ART

OLEDs

Flat panel displays based on organic light emitting devices (OLEDs) have been studied extensively in recent years. OLEDs offer exceptional potential for thinner, more energy efficient displays with equal or better resolution and brightness compared to the current liquid crystal display (LCD) technology. OLEDs also offer high switching speeds, excellent viewing angles (>160°), red, green, and blue (RGB) color selection possibilities, and because no backlighting is necessary, it may be possible to fabricate devices on flexible substrates. However, despite the enormous research and development effort on OLEDs, there are presently few commercially available products using this technology. One of the apparent problems is the need for the development efficient materials to satisfy the electronic device requirements, especially lifetime.

The scientific basis for OLEDs relies on an organic/polymer material's ability to emit light when subjected to electrical stimuli. In this process, electrons and holes are injected into the material from respective electrodes and diffuse through the material. The electrons and holes then recombine creating an excited state within an organic/polymer emissive layer. The excited state can then undergo radiative decay emitting a photon. Depending on the organic/polymer material and its substituents, the wavelength of light emitted can be any color and even multicolored, e.g. red, green, blue, or combinations thereof.

For optimal operation, it is important that the rate at which the holes and electrons diffuse into and through this emitting layer be similar, and preferably matched. Hence, numerous efforts have been made to optimize transport of both holes and electrons to the emitting layer and also to prevent trapping of holes or electrons that leads to destructive effects within the devices. Most recently, efforts have been made to incorporate organic molecules or polymers that promote transport of holes or electrons within the OLED device. Still more recently, efforts have been made to incorporate organic molecules or monomer units within polymeric systems such that one organic unit promotes hole or electron conduction and a second organic unit promotes emission. Such electronic tuning is designed to minimize the transport barriers and maximize the hole/electron injection balance, thereby enhancing the potential for radiative decay rather than non-radiative decay in the form of heat. Considerable work in this area remains. Device stability, electronic efficiency, and manufacturing simplicity have been ongoing challenges in fabricating such devices.

Early examples of organic electroluminescence were reported by Pope et al. in 1963 [Pope, M.; Kallmann, H.; Magnante, P. *J. Chem. Phys.* 1962, 38, 2042] who demonstrated blue light emission from single crystal anthracene using very high voltages, ≈400 V.

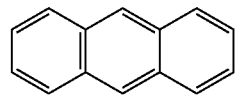

Anthracene

Advances on OLED processing over the next two decades were limited to forming thin, light emitting films of organic compounds by vacuum deposition techniques, [Vincett, P. S.; Barlow, W. A.; Hann, R. A.; Roberts, G. G. *Thin Solid Films* 1982, 94, 476] and lowering driving voltages to <30V, however these single-layer devices suffered from both poor lifetimes and luminescence efficiencies. In 1987, Tang and Van Slyke [Tang, C. W.; Van Slyke, S. A. *Appl. Phys. Lett.* 1987, 51, 913] at Eastman Kodak discovered that strategically designed two-layer electroluminescent devices could be fabricated with voltages, brightness and efficiencies for commercial display applications. As shown in FIG. 1, the OLED device 10 was prepared by sandwiching organic hole transport (HT) material 12 and emissive (EM) material 14 between an indium-tin-oxide (ITO) anode 16 and magnesium/silver alloy cathode 18 layers. A conventional electric potential source 20 was connected to the cathode 18 and anode 16. A glass substrate 22 allowed light emission as shown by Arrows 24. The hole transport (HT) and emissive (EM) materials used by Tang and Van Slyke are shown below.

Materials used by Tang and Van Slyke

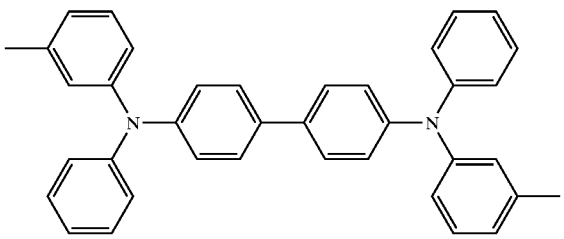

TPD-Hole transport

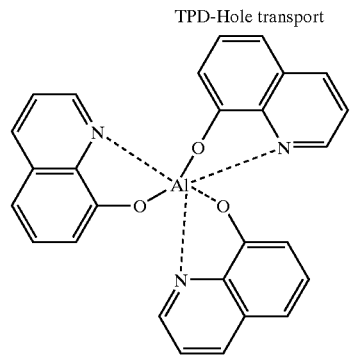

Alq₃/Emissive/
Electron transport

The key to device performance was the layered architecture sequence: cathode/emissive-electron transport-hole transport/anode. These devices demonstrated brightness, efficiencies, and lifetimes far exceeding anything reported at that time. The materials shown in FIG. 1 were deposited onto indium tin oxide (ITO) coated glass by a vacuum sublimation process to a thickness of ≈25 nm.

In 1990 Burroughs et al. [Burroughs, J. H.; Bradley, D. D. C.; Brown, A. R.; Marks, R. N.; Mackay, K.; Friend, R. H.; Burn, P. L. *Nature* 1990, 347, 539] developed polymeric OLED devices or PLEDs. In 1992, Braun et al. [Braun, D.; Gutafson, D.; McBranch, D.; Heeger, A., J. *J. Appl. Phys.*, 1992, 72, 546] discovered that poly(p-phenylenevinylene) (PPV), and its derivatives will electroluminesce both green and red light when confined between ITO and aluminum electrodes.

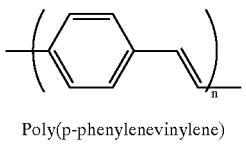

Poly(p-phenylenevinylene)

This work was important because PPV polymers can be deposited by a spin coating process that is more cost effective than vacuum sublimation. Spin coating also facilitates coating larger areas. As a result of these pioneering examples, hundreds of OLED and PLED based papers have been reported by research groups around the world using the following two common materials deposition approaches:

1. Vacuum sublimation of molecular species; and
2. Dip, spin, and spray coating or printing of oligomeric or polymeric materials.

Each method has advantages and disadvantages as outlined below.

Vacuum sublimation works well only with relatively low molecular weight (MW) compounds (<600 g/mol). Such compounds must be purified by sublimation or column chromatography to purities >99.99% prior to deposition to obtain superior light emitting efficiencies and device lifetimes. Vacuum sublimation allows for multi-layer configurations and very precise control of film thickness, both of which are advantageous in OLED processing. Drawbacks to vacuum sublimation are that it requires very costly equipment and it is limited to deposition on surface areas that are much smaller than surfaces that can be coated using spin coating. Additionally, device performance is adversely affected by the tendency of some sublimed compounds to crystallize with time. To prevent premature crystallization, compounds are currently being designed with high glass transition temperatures (Tgs) and substituents that minimize or prevent crystallization.

Dip coating, spin coating, spray coating, and printing techniques are generally applicable to the deposition of oligomeric and polymeric materials. It permits precise film thickness control, large area coverage and is relatively inexpensive compared to vacuum sublimation. Multi-layer configurations are only possible if the deposited layers are designed with curable functional groups for subsequent cross-linking, or with differing solubilities to prevent re-dissolution during additional coatings. For example, current OLED polymer technology uses a water soluble prepolymer PPV (shown below), that is thermally cured after deposition rendering it insoluble. [Li, X. C.; Moratti, S. C. *Semiconducting Polymers as Light-Emitting Materials*; Wise, D. L., Wnek, G. E., Trantolo, D. J., Cooper, T. M. and Gresser, J. D., Ed., 1998].

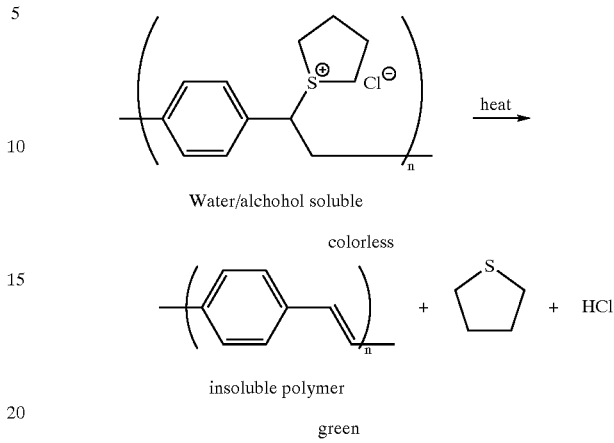

Initial luminescent properties for OLEDs based on polymers were often inferior to their molecular counterparts. This was partly due to the difficulty in obtaining high purity material (99.99%) (polydispersity, endgroups, residual solvents and byproducts such as HCl, catalysts, etc.) necessary for efficient devices. However recent studies have shown that carefully purified polymers have similar or even better resultant properties to their molecular counterparts.

Some important parameters to consider when designing novel materials for practical devices include:
1) Methods of deposition—Spin, spray, dip coating and ink (bubble) jet printing are typically more cost effective than vacuum sublimation. Therefore, the luminescent material is preferably usable with spraying, spin coating, dip coating, and/or printing methods.
2) Materials molecular architecture—materials should be designed to prevent or minimize crystallization and/or aggregation that are known to yield inferior device properties.
3) Color tuning and color purity—Luminescent materials should be designed to provide red, green, and blue (RGB) electroluminescence for full color devices. They should be readily purified to >99.99% purity.
4) Increase in device efficiency, brightness, and lifetime—To provide devices for commercial application, materials should provide >2% external quantum efficiency (2 photons emitted per 100 injected electrons), >500 cd/m$^2$ operating at <5 V, and luminescence half-lives >10,000 hours (roughly equivalent to 10 h/day, 6 days/week for 3 years).
5) Construction of efficient device architectures—The most commonly reported design is shown in FIG. 1. Cathodes are generally prepared by vacuum deposition of Ag/Mg, Ca, or Al. Typically cathodes with lower work functions provide better initial device performance—i.e. Ca<Al/Li/Ag/Mg<Al. However, as Ca, Ag, and Mg are more susceptible to oxidation, Al is generally the cathode material of choice. The anodes are typically commercially available ITO coated glass. Studies show that final device performance is directly correlated to the ITO surface properties; thus, extreme care should be taken when selecting the ITO anode. Alternatively, poly(aniline) (PANI), and poly(2,3-ethylenedioxy)thiophene (PEDOT) have been used as anode material on both ITO deposited on glass and flexible Mylar substrates.

From the foregoing, it will be appreciated that there is a need in the art for OLED materials that can be easily and highly purified, that have high Tgs and little tendency to crystallize or aggregate, that can be processed quickly and efficiently, that are exceptionally resistant to thermal, oxidative, hydrolytic and electrolytic degradation, that can be readily modified to permit tailoring of properties, e.g. stability, electroluminescent efficiencies, solubility, etc., that have low turn-on voltages and relative ease in color tuning.

Nanocomposite Thin Films

To date, the efficient synthesis and processing of multi-layered organic/inorganic nanocomposites remains an elusive goal of the materials chemist. A recent publication reported the rapid, efficient, continuous method to form layered nanocomposites via evaporation induced supramolecular self-assembly (SSA). Sellinger, A., et al., "Continuous self-assembly of organic-inorganic nanocomposite coatings that mimic nacre," Nature, 1998, 394, 256–60, which is incorporated by reference. During dip coating of homogeneous sols containing alcohol or etheral solvents, silica precursors, organic monomers, initiators, and surfactant (at an initial concentration below the critical micelle concentration [cmc]), solvent evaporation induces the formation of micellar structures that co-organize with silica to form cubic, hexagonal or lamellar mesophases. The organic monomers and initiators are solvated within the hydrophobic micellar interiors. Subsequent photo or thermal polymerization and washing results in a silica/polymer thin film nanocomposite.

This technology can be extended to LED device fabrication by incorporating hole transport, electron transport, and emissive electroluminescent monomers and polymers that will be organized into a layered nanostructure. Preliminary evidence has shown that isolation of electroluminescent materials into layered structures provide an enhanced emissive effect compared to their bulk counterparts. Gin, D. et. al., J. Am. Chem. Soc., 1997, 119(17), 4092–4093.

The exceptional strength, hardness, and toughness of biological nanocomposite systems, composed of seemingly mundane materials, have fueled considerable attention from scientists of many disciplines. Mann, S., Nature, 1993, 365, 499–505. As a result, over 70 such bioceramic nanocomposite materials have been discovered and undoubtedly more will follow. Heuer, A., et al., Science, 1992, 255, 1098–1105.

Of these materials, the most highly studied is that of abalone shell nacre which has an oriented coating composed of alternating layers of aragonite ($CaCO_3$) and biopolymer (~1 vol %). The organism fabricates the layers with precise microstructure to minimize pores and other defects. As a result, the bioceramic has aesthetic qualities, smooth surface finishes and is two-times harder and 1000-times tougher than their constituent phases. Jackson, A., et al., Proc. R. Soc. Lond. B., 1988, 234, 415–425.

In an attempt to mimic these examples from nature, a synthetic process termed "biomimetics" has gained momentum within the scientific community. Such approaches include crystallization beneath Langmuir monolayers (Fendler, J. et al., Adv. Mater., 1995, 7, 607–632; Heywood, B. et al., Adv. Mater., 1994, 6, 9–19), crystallization on self-assembled monolayers (Tarasevich, B. et al., Chem. Mater., 1996, 8, 292–300), supramolecular self-assembly (SSA) (Yang, H., et al., Mater. Chem., 1997, 7, 1755–1761; Lu, Y., et al., Nature, 1997, 389, 364–368), and sequential deposition (SD) (Keller, S. et al., J. Am. Chem. Soc., 1994, 116, 8817–8818). Of these only SSA and SD offer the ability to introduce the periodic microstructural and compositional changes necessary for layered nanocomposite formation. Lamellar films have been prepared utilizing SSA but these structures collapse upon surfactant removal via washing or thermal processes (Ogawa, M., J. Am. Chem. Soc., 1994, 116, 7941–7942). Stable inorganic/organic nanocomposites (Kleinfeld, E., et al., Science, 1994, 265, 370–373) have been prepared with SD, but this process has some experimental disadvantages, as it requires many repeated deposition steps to build-up a practical coating thickness.

The efficient polymer/silica nanocomposite self-assembly method reported by Sellinger et al., above, is based on a simple spin or dip-coating procedure. The process begins with a homogenous solution of soluble silicates, coupling agent, surfactant, organic monomers, and initiators prepared in either ethanol/water or THF/water solvent systems with an initial surfactant concentration ($c_o$) below the critical micelle concentration (cmc). Preferential evaporation of the ethanol or THF during dip-coating progressively enriches the concentrations of water, HCl, and other non-volatile solution components within the depositing film. During solvent evaporation, alcohol soluble organic monomers, and initiators migrate into the hydrophobic portion of the forming micelles. Continued evaporation promotes cooperative assembly of these micellar species into interfacially organized liquid crystalline (LC) mesophases. This organizes both the inorganic and organic precursors simultaneously into the desired structure in a rapid (~10 sec.) continuous process. Photo- or thermally-induced organic polymerization combined with continued inorganic polymerization locks in the nanocomposite architecture and covalently bonds the organic-inorganic interface.

From the foregoing, it would be an advancement in the art to provide a method of producing a new light emitting device material formed by the self-assembly of organic-inorganic nanocomposite thin films. It would be a further advancement to provide such materials with hole transport, electron transport, and/or emissive compounds, and to fabricate electroluminescent devices from such materials.

DISCLOSURE OF THE INVENTION

The present invention is directed to a process for producing new light emitting device material formed by the spontaneous evaporation-induced self-assembly of hole transport (HT), electron transport (ET), and emissive materials (EM) into layered organic-inorganic nanocomposite thin films. The present invention also includes luminescent ordered nanocomposite structures having a plurality of silica layers that are chemically bound to organic compounds disposed between the silica layers. The organic compounds contain hole transport, electron transport, and/or emissive functional groups. Organic-inorganic HLED devices may be prepared based upon the nanocomposite thin films disclosed herein.

In the process for preparing luminescent organic-inorganic nanocomposite thin films, a homogenous solution is obtained that contains various process reactants. The solution is in a solvent system of water and an organic solvent. It preferably contains a soluble silicate, a silica coupling agent containing a silica reactive moiety and an organic reactive moiety, a surfactant having a hydrophobic portion and a hydrophilic portion, and an organic material containing a functional moiety substituent selected from hole transport, electron transport, and emissive material moieties. The organic material is soluble or dispersible in the homogeneous solution, and the surfactant concentration is initially below the critical micelle concentration.

A film of the homogeneous solution is deposited on a substrate. The organic solvent is preferentially evaporated to enrich the concentration of water and non-volatile solution components within the depositing film. This promotes micelle formation, such that the organic material migrates into a hydrophobic portion of the forming micelles. Continued evaporation promotes self-assembly of the micelles into interfacially organized liquid crystalline mesophases. The formation of self-assembled liquid crystalline mesophases typically occurs in less than approximately one minute.

The process further includes the step of initiating and propagating a reaction between the organic material and the silica coupling agent to form a nanostructure self-assembly. This reaction may be initiated in a variety of ways known in the art, but it is preferably thermal-, chemical-, or photo-induced. Thereafter, the surfactant may be selectively removed by washing.

The organic solvent of the homogeneous solution may be a lower alkyl alcohol ($C_1$ to $C_4$) or a polar aprotic solvent, such as tetrahydrofuran (THF), diethylether, dioxane, N,N-dimethylformamide (DMF), N,N-dimethylacetamide (DMAC), N-methylpyrrolidone (NMP), dimethyl sulfoxide (DMSO), or acetone.

The functional moiety substituent of the organic material preferably contains a reactive functional group selected to react with the silica coupling agent. The reactive functional group may be, for example, selected from methacrylate, acrylate, styrenyl, vinyl, alkyl halide, epoxy, and amino.

The soluble silicate included in the homogeneous solution may be $Si(OR_{4-n})_4$, where R is lower alkyl ($C_1$–$C_4$) and n is 0 to 3. Tetraethylorthosilicate is a presently preferred soluble silicate. The soluble silicate may be treated with catalytic acid or base to initiate a sol-gel process within the deposited thin film.

The surfactant included in the homogeneous solution is preferably an amphiphilic surfactant. The surfactant can be anionic, cationic, nonionic, or block copolymer. Anionic surfactants that can be used include, but are not limited to, sulfates, sulfonates, phosphates and carboxylic acids. Cationic surfactants that can be used include, but are not limited to, alkylammonium salts, gemini surfactants, cetylethylpiperidinium salts, and dialkydimethyl ammonium. Nonioinic surfactants that can be used, with the hydrophilic group not charged, include, but are not limited to, primary amines, poly(oxyethylene) oxides, octaethylene glycol monodecyl ether, and octaethylene glycol monohexadecyl ether. The initial surfactant concentration in the homogeneous solution should be below the critical micelle concentration (cmc). If the surfactant concentration is greater than the cmc, then precipitation of bulk reactants can occur and prevent the nanocomposite self-assembly process.

The electron transport moiety may be selected from known and novel electron transport moieties including, but not limited to, aromatic pyridines, aromatic boranes, quinolines, triazoles, oxadiazoles, dicyanoimidazoles, and triazines, and derivatives and combinations thereof. The hole transport moiety may be selected from known and novel hole transport moieties including, but not limited to, aromatic phosphines, aromatic amines, thiophenes and polythiophenes, silanes and polysilanes, or derivatives and combinations thereof. The emissive moiety may be selected from known and novel emissive moiety groups including, but not limited to, the following functional moiety substituent groups:

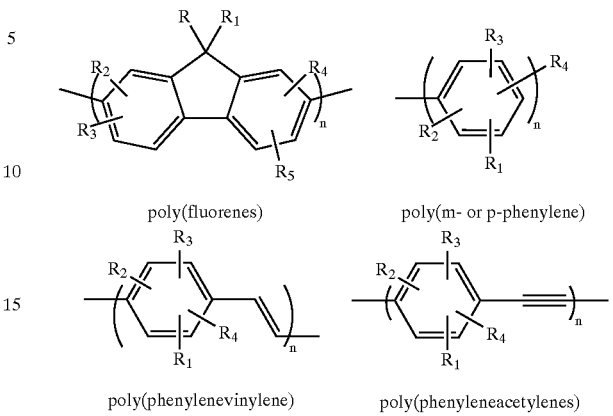

poly(fluorenes)    poly(m- or p-phenylene)

poly(phenylenevinylene)    poly(phenyleneacetylenes)

Where $R$–$R_5$ are the same or different selected from H, C, O, N, S, Si, Ge, fluoroalkanes, flourosilylalkanes, solubilizing groups, and reactive functional groups, and n is selected to provide desired emissive properties and ranges from 1 to 100. Other emissive materials that may be used in the present invention include metal:ligand complexes where the metal includes, but is not limited to: Al, B, Ir, Pt, Eu, Tr, and the ligand includes, but is not limited to: quinoline, bipyridine, and pyridine.

The nanostructure self-assembly structure will comprise a plurality of silica layers. The structure can conform to the substrate, which will commonly be flat. The nanostructure self-assembly may have a tubular (hexagonal) structure. The silica in the silica layers are chemically bound to organic compounds disposed between the silica layers that contain electron transport, hole transport, and/or emissive functional groups, described above. The individual layers may range in thickness from 1 to 500 nm, with the total film thickness ranging from 10 nm to 100 $\mu$m.

Organic-inorganic HLED devices may be prepared based upon the nanocomposite thin films disclosed herein. Such devices may include an anode containing a high work function metal or metal alloy, a cathode containing a low work function metal or metal alloy, and a luminescent ordered nanocomposite structure, such as those described above, electrically connected to the anode and cathode. Typically, the device is fabricated on a transparent substrate.

Known and novel anode materials may be used, including, but not limited to gold, silver, copper, fluorine-tin oxide (FTO), and indium-tin oxide (ITO). The anode may include conductive polymeric materials such as poly(aniline) (PANI) and poly(2,3-ethylenedioxy)thiophene (PEDOT).

Known and novel cathode materials may be used, including, but not limited to calcium, magnesium, lithium, sodium, aluminum, and alloys thereof. The cathode may include mixtures of calcium, magnesium, lithium, sodium, and aluminum with halogen salts of a group IA metal.

DETAILED DESCRIPTION OF THE PREFERRED EMBODIMENTS

Figure 1:
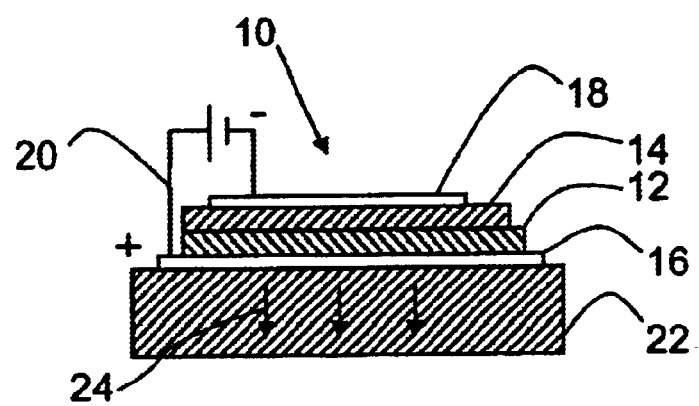
FIG. 1 is a schematic illustration of a typical OLED device configuration.

The present invention is directed to a self-assembly process for preparing photo- and electroluminescent ordered nanocomposite structures, such as layered (lamellar) thin films and tubular (hexagonal, cubic, etc.) structures. The invention also includes the luminescent ordered nanocomposite structures prepared by the process and the organic-inorganic HLED devices fabricated from the luminescent organic-inorganic nanocomposite structures. In one embodiment within the scope of the present invention, the luminescent ordered nanocomposite structures are prepared by an evaporative self-assembly process similar to the process disclosed in Sellinger et al., above.

In the present invention, a homogeneous solution is obtained in a solvent system of water and an organic solvent. The organic solvent is preferably selected from lower alkyl alcohols ($C_1$ to $C_4$), and aprotic solvents, such as tetrahydrofuran (THF), diethylether, dioxane, N,N-dimethylformamide (DMF), N,N-dimethylacetamide (DMAC), N-methylpyrrolidone (EM), dimethyl sulfoxide (DMSO), and acetone. The homogeneous solution preferably includes a soluble silicate, a silica coupling agent, a surfactant, and an organic material containing a functional moiety substituent selected from hole transport (HT), electron transport (ET), and emissive material (EM) substituents. The soluble silicate is preferably $Si(OR_{4-n})_4$, where R is lower alkyl ($C_1$ to $C_4$) and n is 0 to 3. One presently preferred soluble silicate is tetraethylorthosilicate. The silica coupling agent contains a silica reactive moiety and an organic reactive moiety, such that the coupling agent can chemically couple the organic material to silica. The surfactant has a hydrophobic portion and a hydrophilic portion, and it has an initial concentration below the critical micelle concentration. The surfactant is preferably an amphiphilic surfactant. The organic material is preferably soluble or dispersible in the homogeneous solution.

In the process, a film of the homogeneous solution is deposited on a substrate. Typical substrates include an anode or cathode of an electroluminescent device or other surface. The soluble silicate is preferably treated with catalytic acid or base to initiate a sol-gel process within the deposited thin film. As used herein, a catalytic acid or base is less than 10 mole percent with respect to the silica. The organic solvent is preferentially evaporated to enrich the concentration of water and non-volatile homogeneous solution components within the depositing film. This promotes micelle formation. As the micelles form, the organic material migrates into a hydrophobic portion of the forming micelles. Continued evaporation promotes self-assembly of the micelles into interfacially organized liquid crystalline mesophases. The self-assembled liquid crystalline mesophases typically form in less than approximately one minute.

At this point, a reaction between the organic material and the silica coupling agent is initiated and propagated so as to chemically attach the HT, ET, and EM moieties to the inorganic silica matrix and form the nanostructure self-assembly. To facilitate chemical reaction between the organic material and the silica coupling agent, both the coupling agent and the organic material preferably include reactive functional groups selected to react with each other. Examples of such reactive functional groups include, but are not limited to, methacrylate, acrylate, styrenyl, vinyl, alkyl halide, epoxy, and amino. The chemical reaction between the organic material and the coupling agent is preferably a thermal or photo-induced free radical process. The surfactant can then be selectively removed by washing, such as with a hot alcohol solution.

The following are examples of typical electron transport moieties that can be associated with the organic material and incorporated into the nanocomposite structures within the scope of the present invention. The illustrated compounds are given by way of example only. Persons skilled in the art will appreciate that other known and novel electron transport moieties can be used in the present invention, including but not limited to, organic compounds containing aromatic pyridines, aromatic boranes, quinolines, triazoles, oxadiazoles, triazines, and dicyanoimidazoles or their combination, where $R_1$–$R_4$ are the same or different selected from H, C, O, N, S, Si, Ge, fluoroalkanes, fluorosilylalkanes, solubilizing groups, and reactive functional groups.

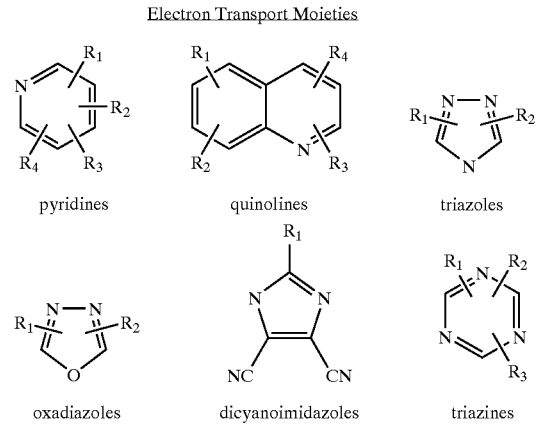

The following are examples of typical hole transport moieties that can be linked with the organic material and incorporated into the nanocomposite structures within the scope of the present invention. The illustrated compounds are given by way of example only. Persons skilled in the art will appreciate that other known and novel hole transport moieties can be used in the present invention, including, but are not limited to, organic compounds containing aromatic phosphines, aromatic amines, thiophenes (polythiophenes), silanes (polysilanes), and derivatives, where $R_1$ $R_9$ are the same or different selected from H, C, O, N, S, Si, Ge, fluoroalkanes, fluorosilylalkanes, solubilizing groups, and reactive functional groups, and n is selected to provide desired emissive properties and ranges from 1 to 100.

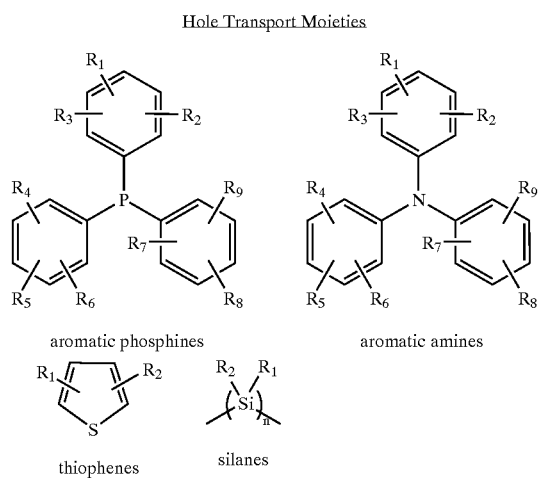

Hole Transport Moieties aromatic phosphines   aromatic amines thiophenes   silanes The following are examples of typical emissive material moiety substituents that can be associated with the organic material and incorporated into the nanocomposite structures within the scope of the present invention. The illustrated compounds are given by way of example only. Persons skilled in the art will appreciate that other known and novel emissive moieties can be used in the present invention.

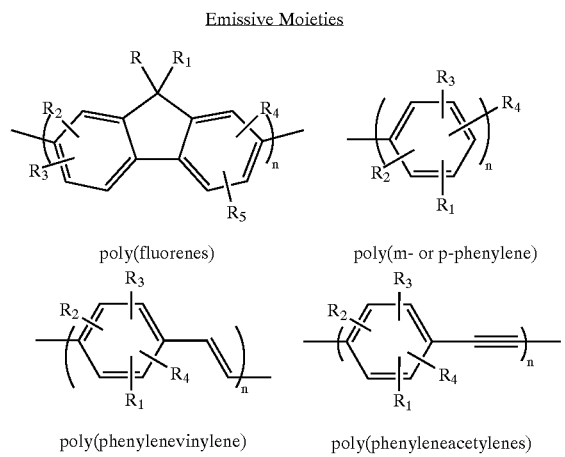

Emissive Moieties poly(fluorenes)   poly(m- or p-phenylene)

poly(phenylenevinylene)   poly(phenyleneacetylenes)

Where $R-R_5$ can be the same or different selected from H, C, O, N, S, Si, Ge, fluoroalkanes, fluorosilylalkanes, solubilizing groups, reactive functional groups, etc., and n is selected to optimize emissive properties and will typically range from 1 to 100, more preferably from 10 to 50. Other emissive materials that may be used in the present invention include metal:ligand complexes where the metal includes, but is not limited to: Al, B, Ir, Pt, Eu, or Tr, and the ligand includes, but is not limited to: quinoline, bipyridine, or pyridine. It is also noted that combinations of HT/emissive and ET/emissive materials, whether physically blended or covalently bonded, may be incorporated into the nanocomposite structure within the scope of the present invention.

In another embodiment of the process of preparing a luminescent organic-inorganic nanocomposite thin film, a silica sol is admixed with a silica coupling agent, a surfactant having a concentration below the critical micelle concentration, an organic solvent, and an organic material containing a HT, ET, or EM functional moiety substituent. The organic solvent is selectively evaporated to induce micelle formation. Continued evaporation promotes cooperative assembly of these micellar species into interfacially organized liquid crystalline mesophases. As explained above, a chemical reaction between the organic material containing the HT, ET, and/or EM functional moiety and the silica coupling agent is initiated and propagated. This reaction locks in the nanocomposite architecture of the nanocomposite thin film.

The luminescent ordered nanocomposite structures prepared according to the process of the present invention include a plurality of silica layers. The silica is chemically bound to organic compounds disposed between the silica layers, wherein the organic compounds contain electron transport, hole transport, and/or emissive functional groups.

The present invention includes organic-inorganic HLED devices fabricated with a luminescent organic-inorganic ordered structure. Such devices typically include an anode containing a high work function metal or metal alloy, a cathode containing a low work function metal or metal alloy, and a layer of the organic-inorganic luminescent based upon the chemical structures described above, physically and thus electrically connected to the anode and cathode. The organic-inorganic HLED devices are preferably fabricated on a transparent substrate such as glass or clear plastic.

The anode is preferably selected from gold, silver, copper, indium-tin oxide (ITO), fluorine-tin oxide (FTO), or other transparent conducting oxide or polymeric materials. Below about 50 nm, gold, silver, and copper layers are semi-transparent rendering them useful anode materials. Alternatively, poly(aniline) (PANI), and poly(2,3-ethylenedioxy)thiophene (PEDOT) can be used as anode material on both ITO deposited on glass and flexible Mylar substrates.

The cathode is selected from calcium, magnesium, lithium, sodium, aluminum, and alloys thereof. The cathode may also be selected from mixtures of calcium, magnesium, lithium, sodium, and aluminum with halogen salts of group IA metals (Li, Na, K, Rb, Cs).

Figure 2:
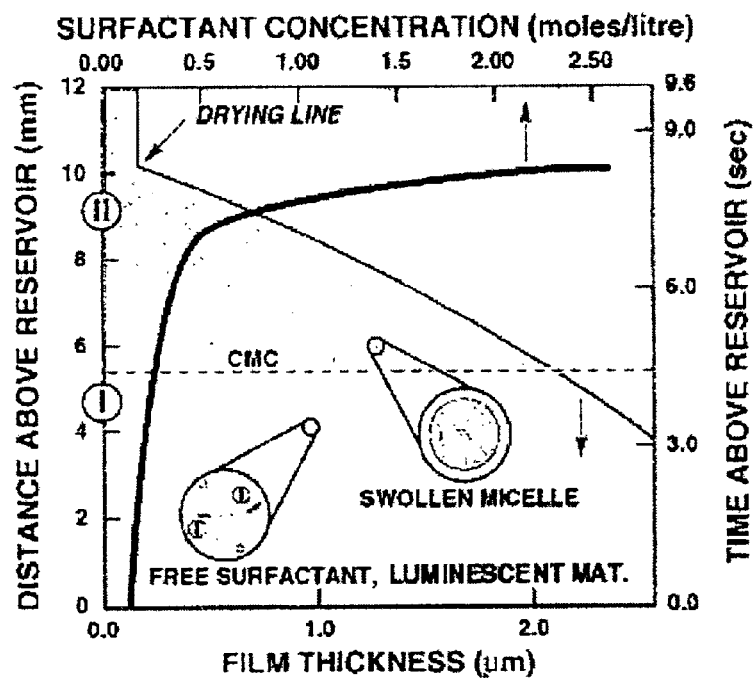
FIG. 2 is a schematic depicting the evolution of nanolaminate structure during dip-coating.
Figure 3:
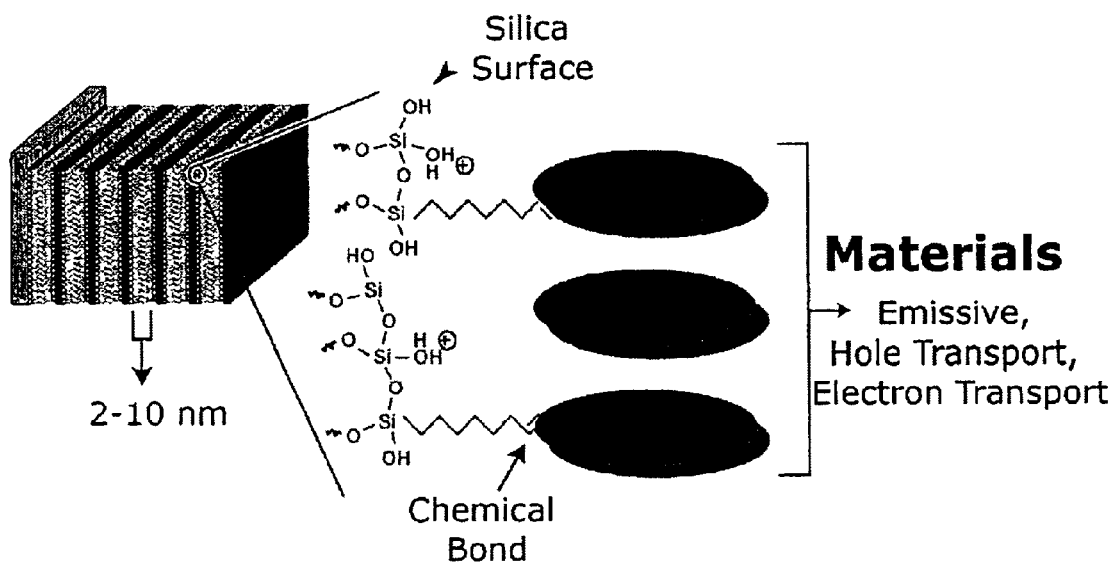
FIG. 3 is a molecular level view of the silica/emissive material interface after deposition and prior to polymerization.

The organic portion of the network is preferably designed to use polymerizable or low to moderate molecular weight electron transport, hole transport and/or emissive materials that may be incorporated into the layered structure as depicted in FIGS. 2 and 3. FIG. 2 is a schematic depicting the evolution of nanolaminate structure during dip-coating. The dip-coating rates ranged from 3–10 inches/minute. The steady-state film-thinning profile established by evaporation is shown, with vertical axes representing distance/time above sol reservoir surface, and horizontal axes showing film thickness and surfactant concentration. FIG. 3 is a molecular level view of the silica/emissive material interface after deposition and prior to polymerization. It represents a section near point II, labeled on the "Distance Above Reservoir" axis showing the nanolaminate construction and arrangement of the emissive material (EM), hole transport (HT), and/or electron transport (ET) materials. The organic materials used with the present invention preferably fulfill the following conditions a 1. The HT-, ET-, and emissive; materials preferably have some component in their chemical structure to tolerate solvent systems that contain water. Tolerate in this context refers to maintaining a homogeneous solution or stable dispersion without precipitating out the HT, ET, and/or emissive species. For example, sol-gel formulations must contain water to allow for metal alkoxide condensation to form the intended ceramic material (Equation 1).

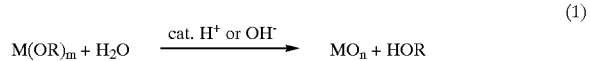
(1)

Equation 1 illustrates the sol-gel chemistry showing the catalytically induced condensation of tetraalkoxy compounds to form oxides in the presence of, at least, stoichiometric water. R=methyl, ethyl, propyl, isopropyl, butyl; M=Si, Ti, Zr, Al, etc., and mixtures thereof m and n=1–10.

2. The HT-, ET-, and emmissive materials preferably have optimized molecular weights, i.e. large enough to impart useful photo- and electroluminescent properties, yet small enough to allow for migration into the interior portion of the micelles during the evaporation induced self-assembly (EISA) process (see FIG. 2).

3. The HT-, ET-, and emissive materials preferably have a reactive moiety that allows for chemical connectivity to the metal oxide matrix via a chemical, thermal, or photo-activated mechanism. The HT-, ET-, and emissive materials may be prepared as silica coupling agents having a reactive silica moiety and an organic reactive moiety.

4. The metal alkoxide material must have some component that allows for reactivity with the matrix material as well as with the HT-, ET-, and emissive materials (see FIG. 2).

The hole, electron, and emissive monomers are preferably designed with both unsaturated, (i.e. methacrylate, styrenyl, vinyl) and trialkoxysilyl groups so that they may be covalently linked to the silica structure via thermal, photo-induced, and chemical processes. This covalent linking permits surfactant removal leaving the OLED materials.

Typical chemical processes to produce the HT, ET and emissive materials useful in the present invention are described below. In all cases X is Cl, Br, I, triflate, or other leaving group and Ar is aromatic:

Gilch process to produce polyphenylenevinylene:

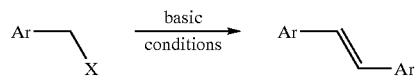

Palladium catalyzed Heck reactions with vinyl groups:

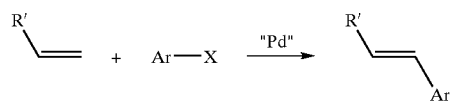

Palladium catalyzed Suzuki reaction of a halophenyl with activated aromatic compounds is shown below:

Palladium catalyzed Buchwald-Hartwig amination reaction of activated aromatic compounds with aromatic amines is shown below:

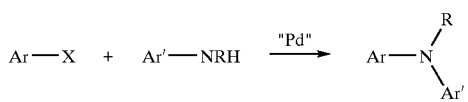

The above reactions can be used to make polymers, oligomers, starburst molecules, dendrimers, etc. that can be inserted into the swollen micelles during the evaporation induced self-assembly process.

EXAMPLES

The following examples are given to illustrate various embodiments within the scope of the present invention. These are given by way of example only, and it is to be understood that the following examples are not comprehensive or exhaustive of the many embodiments within the scope of the present invention.

Example 1

The initial silica precursor stock solution is prepared by refluxing TEOS (120 mL) [Si(OCH$_2$CH$_3$)$_4$], THF (120 mL), water (9.8 mL), and 0.07N HCl (0.4 mL) at 60° C. for 90 minutes. This solution can be stored at −20° C. for 1 year. The acid concentration and reaction time are adjusted so as to minimize the size and condensation rate of the silica species. THF may also be replaced by ethanol, methanol, isopropanol, and aprotic solvents, such as diethylether, dioxane, N,N-dimethylformamide (DMF), N,N-dimethylacetamide (DMAC), N-methylpyrrolidone (NMP), dimethyl sulfoxide (DMSO), and acetone.

Example 2

A portion of the silica precursor solution from Example 1 (17 mL) is diluted with THF (20 mL), followed by addition of water (0.7 mL), 0.07N HCl (2.1 mL) and cetyltrimethylammonium bromide (CTAB, surfactant, 1.7 g). A hole transport material, N4'-(9,9-dimethyl-9H-fluoren-2-yl)-N4-(9,9-dimethyl-9H-fluoren-3-yl)-N-4-phenyl-N4'-[4-(vinyltriethoxysilyl)-phenyl]-biphenyl-4,4'-diamine, (shown below, 1 g) dissolved in 20 mL THF is added to the solution with stirring followed by addition of 7-octenyltrimethoxysilane (silica coupling agent, 0.5 g).

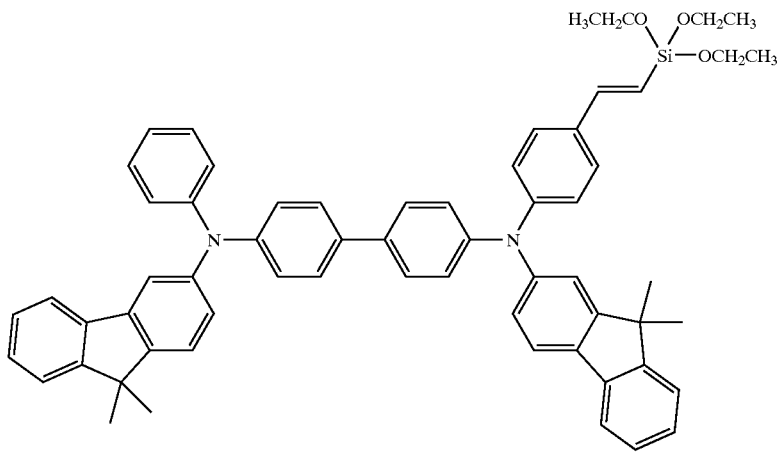

N4'-(9,9-dimethyl-9H-fluoren-2-yl)-N4-(9,9-dimethyl-9H-fluoren-3-yl)-
N4-phenyl-N4'-[4-(vinyltriethoxysilyl)-phenyl]-biphenyl-4,4'-diamine The solution is stirred for 30 minutes. This solution is used immediately for position of thin films or stored at −20° C. where it is stable for up to 1 year.

Example 3

A solution is prepared according to the procedure of Example 2, except the bole transport material is replaced by an electron transport material, 2-naphthalen-1-yl-5-[4-(3,3,3-vinyltriethoxysilyl)-phenyl]-[1,3,4]oxadiazole, (1 g), shown below.

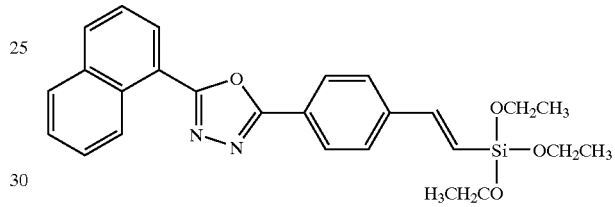

2-naphthalen-1-yl-5-[4-(3,3,3-vinyltriethoxysilyl)
-phenyl]-[1,3,4]oxadiazole

Example 4

A solution is prepared according to the procedure of Example 2, except the hole transport material is replaced by a blue emissive material, anisole terminated co-polymer of 9,9-di-hex-5-enylfluorene and 9,9-di-(2-methoxy-ethoxymethyl)fluorene, (1 g), shown below.

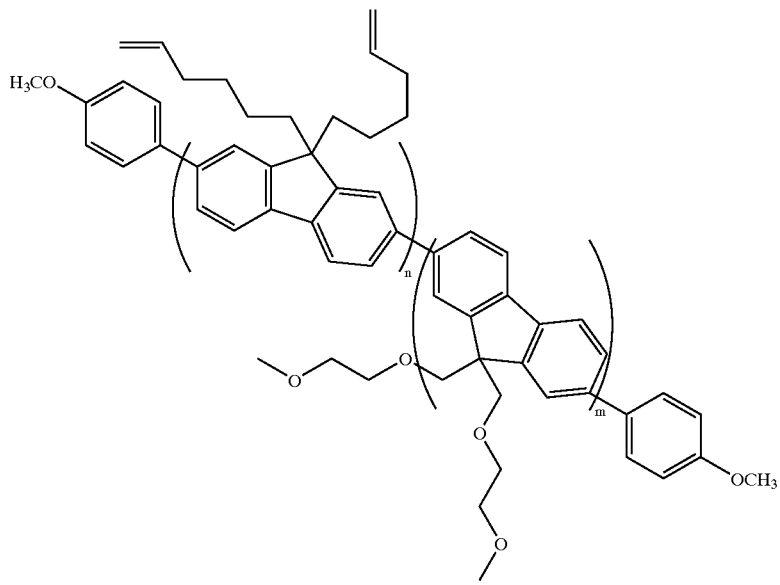

anisole terminated co-polymer of 9,9-di-hex-5-enylfluorene and
9,9-di-(2-methoxy-ethoxymethyl)fluorene

Example 5

A solution is prepared according to the procedure of Example 2, except the hole transport material is replaced by a green emissive material, anisole terminated ter-polymer of 9,9-di-hex-5-enyl)fluorene, (9,9-di-(2-methoxy-ethoxymethyl)fluorene), and benzo-1,2,5-thiadiazole, (1 g), shown below.

The vinyl and trialkoxysilyl groups in Examples 2–6 are used for coupling to the silica framework. The ethyleneoxy side groups are used for solubilizing in water containing solutions. The CTAB cationic surfactant may be replaced by other cationic, non-ionic and anionic surfactants. 7-octenyltrialkoxysilane may be replaced by other coupling agents such as: methacryloxytrialkoxysilanes, allyltrialkoxysilanes, etc.

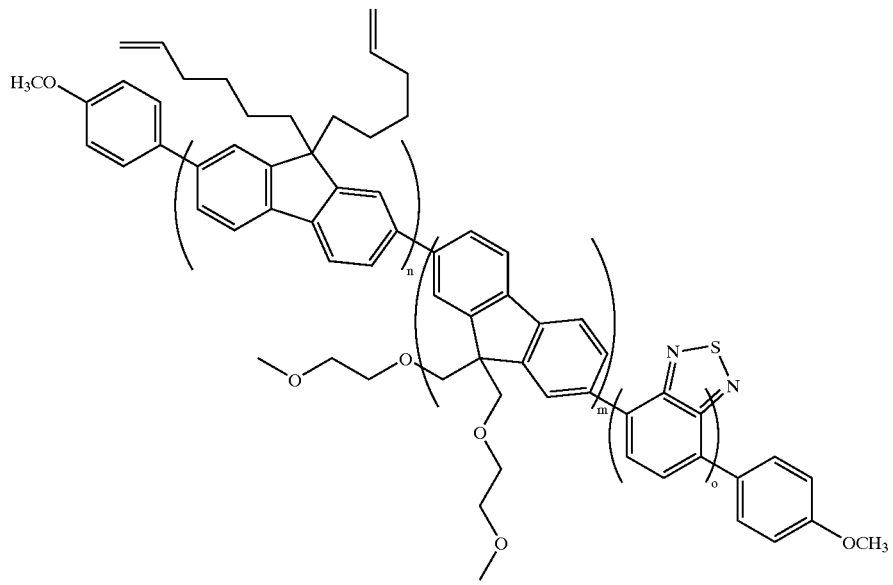

anisole terminated ter-polymer of 9,9-di-hex-5-enyl)fluorene, (9,9-di-(2-methoxy-ethoxymethyl)fluorene), and benzo-1,2,5-thiadiazole

Example 6

A solution is prepared according to the procedure of Example 2, except the hole transport material is replaced by a red-orange emissive material, an anisole terminated copolymer of 1-methoxy-4-[2-2-methoxy-ethoxy)-ethoxy] phenylenevinylene and 1,4-dimethoxy-2,5-bis-pent-4-enyloxy-phenylenevinylene, (1 g), shown below.

Films are deposited on polished (100)-silicon, mica, glass slides, indium tin oxide (ITO), doped zinc oxides, etc. by dip-coating, spin coating or printing, during which time the evaporation-induced self assembly occurs. Thicker coatings required for FTIR measurements and solid state NMR measurements are prepared by dispensing sol in a petri dish followed by immediate vertical draining. Short exposures to ammonia vapor (above a concentrated ammonium hydrox-

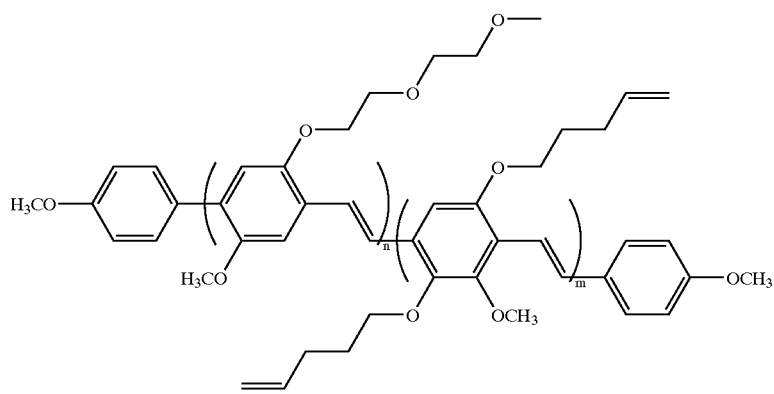

anisole terminated copolymer of 1-methoxy-4-[2-(2-methoxy-ethoxy)-ethoxy]-phenylenevinylene, and 1,4-dimethoxy-2,5-bis-pent-4-enyloxy-phenylenevinylene ide solution for 10 seconds to 5 minutes) may be employed to promote further condensation of the silica framework. Cured coatings are washed sequentially with ethanol, acetone, and diethyl ether to remove surfactant and residual uncured materials.

Example 7

The solution prepared in Example 2 is deposited onto clean ITO coated glass (1 cm×1 cm) by a spin-coating (1000 rpm for 1 minute). This hole transport film layer is exposed to ammonia vapors (from concentrated ammonium hydroxide) for 10 seconds followed by submerging sequentially for 1 minute into stirring ethanol, acetone and diethylether. The film is dried at 80° C. under vacuum for 10 minutes. Next the solution from Example 5 is deposited onto the hole transport layer by spin-coating (1000 rpm for 1 minute). The deposited green emission layer is washed as above and dried at 80° C. for 2 hours. This device is transferred to an inert atmosphere glove box where 1.0 nm CsF followed by 150 nm aluminum are deposited. The turn-on voltage for this device is 3–4 V, with a maximum luminance of 10,000 cd/$M^2$ at 13 V. Similar device characteristics are achieved using other materials described in this invention.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

What is claimed is:

1. A self-assembly process for preparing luminescent organic-inorganic nanocomposite thin films comprising the steps:
    obtaining a homogeneous solution in a solvent system of water and an organic solvent, said homogeneous solution comprising:
        a soluble silicate;
        a silica coupling agent containing a silica reactive moiety and an organic reactive moiety;
        a surfactant having a hydrophobic portion and a hydrophilic portion, said surfactant having a concentration below the critical micelle concentration; and
        an organic material containing a functional moiety substituent selected from hole transport, electron transport, and emissive material moieties and wherein said organic material is soluble or dispersible in the homogeneous solution;
    depositing a film of the homogeneous solution on a substrate; and
    preferentially evaporating the organic solvent to enrich the concentration of water and non-volatile homogeneous solution components within the depositing film to promote micelle formation, such that the organic material migrates into a hydrophobic portion of the forming micelles and wherein continued evaporation promotes self-assembly of the micelles into interfacially organized liquid crystalline mesophases.

2. A process for preparing luminescent organic-inorganic nanocomposite thin films according to claim 1, further comprising the step of initiating and propagating a reaction between the organic material and the silica coupling agent to form a nanostructure self-assembly.

3. A process for preparing luminescent organic-inorganic nanocomposite thin films according to claim 2, wherein the reaction between the organic material and the silica coupling agent is a thermal-induced process.

4. A process for preparing luminescent organic-inorganic nanocomposite thin films according to claim 2, wherein the reaction between the organic material and the silica coupling agent is a photo-induced process.

5. A process for preparing luminescent organic-inorganic nanocomposite thin films according to claim 1, wherein the formation of self-assembled liquid crystalline mesophases occurs in less than approximately one minute.

6. A process for preparing luminescent organic-inorganic nanocomposite thin films according to claim 1, wherein the organic solvent is a lower alkyl alcohol, $C_1$ to $C_4$.

7. A process for preparing luminescent organic-inorganic nanocomposite thin films according to claim 1, wherein the organic solvent is a polar aprotic solvent.

8. A process for preparing luminescent organic-inorganic nanocomposite thin films according to claim 7, wherein the aprotic solvent is selected from tetrahydrofuran (THF), diethylether, dioxane, N,N-dimethylformamide (DMF), N,N-dimethylacetamide (DMAC), N-methylpyrrolidone (NP), dimethyl sulfoxide (DMSO), and acetone.

9. A process for preparing luminescent organic-inorganic nanocomposite thin films according to claim 1, wherein the functional moiety substituent contains a reactive functional group selected to react with the silica coupling agent.

10. A process for preparing luminescent organic-inorganic nanocomposite thin films according to claim 9, wherein the reactive functional group is selected from methacrylate, acrylate, styrenyl, vinyl, alkyl halide, epoxy, and amino.

11. A process for preparing luminescent organic-inorganic nanocomposite thin films according to claim 1, wherein the coupling agent is 7-octenyltrimethoxysilane.

12. A process for preparing luminescent organic-inorganic nanocomposite thin films according to claim 1, further comprising the step of selectively removing the surfactant by washing.

13. A process for preparing luminescent organic-inorganic nanocomposite thin films according to claim 1, wherein the soluble silicate is $Si(OR_{4-n})_4$, where R is lower alkyl ($C_1$–$C_4$) and n is 0 to 3.

14. A process for preparing luminescent organic-inorganic nanocomposite thin films according to claim 1, wherein the soluble silicate is tetraethylorthosilicate.

15. A process for preparing luminescent organic-inorganic nanocomposite thin films according to claim 1, wherein the soluble silicate is treated with catalytic acid or base to initiate a sol-gel process within the deposited thin film.

16. A process for preparing luminescent organic-inorganic nanocomposite thin films according to claim 1, wherein the surfactant is an amphiphilic surfactant.

17. A process for preparing luminescent organic-inorganic nanocomposite thin films according to claim 1, wherein the functional moiety is selected from aromatic pyridines, aromatic boranes, quinolines, triazoles, oxadiazoles, dicyanoimidazoles, triazines, and derivatives and combinations thereof.

18. A process for preparing luminescent organic-inorganic nanocomposite thin films according to claim 1, wherein the hole transport moiety is selected from aromatic phosphines, aromatic amines, thiophenes and polythiophenes, silanes and polysilanes, and derivatives and combinations thereof.

19. A process for preparing luminescent organic-inorganic nanocomposite thin films according to claim 1, wherein the emissive moiety is selected from the following functional moiety substituent groups:

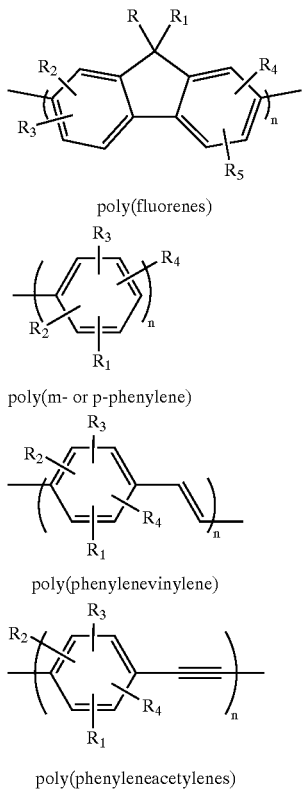

poly(fluorenes)

poly(m- or p-phenylene)

poly(phenylenevinylene)

poly(phenyleneacetylenes)

Where $R_1$–$R_5$ are the same or different selected from H, C, O, N, S, Si, Ge, fluoroalkanes, flourosilylalkanes, solubilizing groups, and reactive functional groups, and n is selected to provide desired emissive properties and ranges from 1 to 100.

20. A process for preparing luminescent organic-inorganic nanocomposite thin films according to claim 1, wherein the emissive moiety is selected from metal:ligand complexes where the metal is: Al, B, Ir, Pt, Eu, or Tr, and the ligand is: quinoline, bipyridine, or pyridine.

21. A process for preparing luminescent organic-inorganic nanocomposite thin films according to claim 1, wherein the nanostructure self-assembly has a layered structure.

22. A process for preparing luminescent organic-inorganic nanocomposite thin films according to claim 1, wherein the nanostructure self-assembly has a tubular structure.

23. A process for preparing a luminescent organic-inorganic nanocomposite thin film comprising the steps:

admixing a silica sol with a silica coupling agent containing a reactive functional group, a surfactant having a concentration below the critical micelle concentration, an organic solvent, and an organic material containing a functional moiety substituent selected from hole transport, electron transport, emissive material moieties and precursors thereof;

evaporating the organic solvent to induce micelle formation and form a liquid mesophase material; and initiating and propagating a reaction between the organic material and the silica coupling agent to form a nanostructure self-assembly.

24. A process for preparing a luminescent organic-inorganic nanocomposite thin film according to claim 23, wherein the silica coupling agent and organic material are combined as a single molecule.

25. A self-assembly process for preparing luminescent organic-inorganic nanocomposite thin films comprising the steps:

obtaining a homogeneous solution in a solvent system of water and an organic solvent, said homogeneous solution comprising:
a soluble silicate;
a silica coupling agent containing a silica reactive moiety and an organic reactive moiety, wherein the organic reactive moiety is a monomer precursor of a hole transport, electron transport, or emissive material; and
a surfactant having a hydrophobic portion and a hydrophilic portion, said surfactant having a concentration below the critical micelle concentration;

depositing a film of the homogeneous solution on a substrate; and preferentially evaporating the organic solvent to enrich the concentration of water and non-volatile homogeneous solution components within the depositing film to promote micelle formation, such that the organic material migrates into a hydrophobic portion of the forming micelles and wherein continued evaporation promotes self-assembly of the micelles into interfacially organized liquid crystalline mesophases.

26. A process for preparing luminescent organic-inorganic nanocomposite thin films according to claim 25, further comprising the step of initiating and propagating a polymerization reaction between the silica coupling agents to form a nanostructure self-assembly.

27. A process for preparing luminescent organic-inorganic nanocomposite thin films according to claim 26, wherein the polymerization reaction is a thermal-induced process.

28. A process for preparing luminescent organic-inorganic nanocomposite thin films according to claim 26, wherein the polymerization reaction is a photo-induced process.

* * * * *

UNITED STATES PATENT AND TRADEMARK OFFICE
CERTIFICATE OF CORRECTION

PATENT NO. : 6,861,091 B2
APPLICATION NO. : 09/749006
DATED : March 1, 2005
INVENTOR(S) : Alan Sellinger Page 1 of 1

It is certified that error appears in the above-identified patent and that said Letters Patent is hereby corrected as shown below:

COLUMN 4
    Line 45, "> 99.99%" should read --≥ 99.99%--.

COLUMN 10
    Line 62, "$R_1 R_9$" should read --$R_1$-$R_9$--.

COLUMN 12
    Line 64, "conditions a:" should read --conditions:--; and
    Line 65, "emissive;" should read --emissive--.

COLUMN 15
    Line 35, "bole" should read --hole--.

COLUMN 20
    Line 28, "(NP)," should read --(NMP),--.

COLUMN 21
    Line 43, "flourosilylalkanes," should read --fluorosilylalkanes--.

Signed and Sealed this

Fifth Day of February, 2008

JON W. DUDAS
*Director of the United States Patent and Trademark Office*